(12) United States Patent
Yanagisawa

(10) Patent No.: US 9,272,463 B2
(45) Date of Patent: Mar. 1, 2016

(54) MOLD FOR NANO-IMPRINTING, METHOD FOR FORMING DIFFRACTION GRATING, AND METHOD FOR PRODUCING OPTICAL DEVICE INCLUDING DIFFRACTION GRATING

(71) Applicant: SUMITOMO ELECTRIC INDUSTRIES, LTD., Osaka-shi, Osaka (JP)

(72) Inventor: Masaki Yanagisawa, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 64 days.

(21) Appl. No.: 14/016,372

(22) Filed: Sep. 3, 2013

(65) Prior Publication Data

US 2014/0073073 A1 Mar. 13, 2014

(30) Foreign Application Priority Data

Sep. 10, 2012 (JP) ................................. 2012-198473

(51) Int. Cl.
| | |
|---|---|
| *H01L 29/06* | (2006.01) |
| *H01L 21/00* | (2006.01) |
| *B29C 59/00* | (2006.01) |
| *H01L 33/10* | (2010.01) |
| *G03F 7/00* | (2006.01) |

(52) U.S. Cl.
CPC ............ *B29C 59/002* (2013.01); *G03F 7/0002* (2013.01); *H01L 33/105* (2013.01)

(58) Field of Classification Search
CPC ..................... H01L 21/02606; H01L 51/0048; H01L 29/0669; H01L 29/413; H01L 51/0045; H01L 51/057; H01L 2221/1094; H01L 2224/05193; H01L 2224/05293; H01L 2224/05493; H01L 2224/05693
USPC .................................. 438/26, 32, 199, 17, 582
See application file for complete search history.

(56) References Cited

U.S. PATENT DOCUMENTS

| | | | |
|---|---|---|---|
| 2009/0092791 A1* | 4/2009 | Terasaki et al. | 428/156 |
| 2010/0081224 A1* | 4/2010 | Yanagisawa | 438/32 |
| 2011/0306185 A1* | 12/2011 | Tsuji | B82Y 20/00 438/478 |
| 2012/0040041 A1* | 2/2012 | Tsuji et al. | 425/385 |
| 2012/0223454 A1* | 9/2012 | Chiba et al. | 264/220 |

FOREIGN PATENT DOCUMENTS

JP 2010-36514 A 2/2010

\* cited by examiner

*Primary Examiner* — Robert Bachner
*Assistant Examiner* — Moin Rahman
(74) *Attorney, Agent, or Firm* — Smith, Gambrell & Russell LLP

(57) ABSTRACT

A method fix forming a diffraction grating includes the steps of preparing a mold including pattern portions each having a pattern corresponding to a pattern for the diffraction grating; forming a first semiconductor layer on a substrate; forming a resin layer on the first semiconductor layer; pressing the pattern portions of the mold against the resin layer; forming the pattern for the diffraction grating in the resin layer by curing the resin layer; and forming the diffraction grating in the first semiconductor layer by etching the first semiconductor layer using the patterned resin layer. The mold includes a first base and a plurality of second bases disposed on the first base. The first base is made of a flexible material. Each second base is made of a rigid material. The second bases each include one pattern portion and are spaced apart from each other with a predetermined distance.

14 Claims, 17 Drawing Sheets

MOLD FOR NANO-IMPRINTING, METHOD FOR FORMING DIFFRACTION GRATING, AND METHOD FOR PRODUCING OPTICAL DEVICE INCLUDING DIFFRACTION GRATING

BACKGROUND OF THE INVENTION

1. Field of the Invention

The present invention relates to a mold for nano-imprinting, a method for forming a diffraction grating, and a method for producing an optical device including a diffraction grating.

2. Description of the Related Art

Instead of a known photolithography method, a nano-imprint lithography (NIL) method has been proposed to form a semiconductor optical device. In such a nano-imprint lithography method, a mold is prepared. The mold has a pattern portion in which a predetermined pattern having projections and recesses is formed. The mold is then pressed against a resin layer formed on a substrate. Thus, the pattern formed on the mold is transferred to the resin layer. The substrate is etched using, as a mask, the resin layer in which the pattern having projections and recesses is formed, and consequently the pattern having projections and recesses is formed on the substrate. In this method, when the projection of the pattern has a height comparable to a surface roughness of the substrate, part of the pattern portion of the mold is not pressed against the resin layer formed on the substrate. In other words, the pattern having projections and recesses of the mold is not uniformly transferred over the entire resin layer. As a result, the pattern having projections and recesses is not uniformly formed on the substrate.

Japanese Unexamined Patent Application Publication No. 2010-36514 discloses that nano-imprinting is conducted using a mold made of a flexible material. Since the mold deforms along the surface of a substrate even when the surface of the substrate is not flat, the pattern portion is fully pressed against the entire resin layer on the substrate. As a result, by etching the substrate using the resin layer as a mask, the pattern having projections and recesses can be formed over the entire substrate.

SUMMARY OF THE INVENTION

However, when the mold disclosed in Japanese Unexamined Patent Application Publication No. 2010-36514 is deformed along the surface of the substrate, the pattern portion of the mold may be distorted because the mold has flexibility. When the shape of the pattern of the mold is deformed, accuracy of the pattern having projections and recesses decreases. In particular, when a diffraction grating having periodic projections and recesses is formed in a semiconductor layer, the deformation of the shape of the pattern for the diffraction grating affects the characteristics of the diffraction grating. Specifically, the deformation of the shape of the pattern of the diffraction grating causes non-uniform change of the period or the like of the diffraction grating. As a result, a shift of the reflection wavelength of the diffraction grating from the design value occurs. Alternatively, the reflectance of the diffraction grating also changes. Such a change in the characteristics of the diffraction grating also considerably affects the characteristics of semiconductor optical devices including a diffraction grating, such as a distributed feedback (DFB) laser.

A method for forming a diffraction grating according to an embodiment of the present invention includes the steps of (a) preparing a mold including a pattern portion in which a pattern for forming a diffraction grating is formed; (b) forming a first semiconductor layer on a main surface of a substrate; (c) forming a resin layer on the first semiconductor layer; (d) pressing the pattern portion of the mold against the resin layer; (e) forming the pattern for the diffraction grating in the resin layer by curing the resin layer while pressing the pattern portion against the resin layer; and (f) forming the diffraction grating in the first semiconductor layer by etching the first semiconductor layer using the patterned resin layer as an etching mask. The mold includes a first base and a plurality of second bases disposed on the first base. The first base is made of a flexible material. The second base is made of a rigid material. In addition, the plurality of second bases each include the pattern portion and are spaced apart from each other with a predetermined distance.

According to the method for forming a diffraction grating, the pattern for a diffraction grating is formed in the resin layer by curing the resin layer while pressing the pattern portion against the resin layer. The surface of the substrate is not flat and may have undulations. In this case, the surface of the resin layer formed on the substrate is also not flat like the substrate. The plurality of second bases are disposed on the first base. Furthermore, the plurality of second bases each include the pattern portion and are spaced apart from each other with a predetermined distance. In addition, the first base of the mold is made of a flexible material, and the second base is made of a rigid material. When the pattern portion of the mold having such a structure is pressed against the resin layer, the flexible first base is bent along the surface of the resin layer. Therefore, even if the surface of the resin layer has undulations, the pattern portion is more fully pressed against the resin layer. In addition, since the second bases have rigidity, the pattern portion of the mold can be prevented from being bent when the pattern portion is pressed against the resin layer. This can prevent the distortion of the pattern having projections and recesses in the pattern portion. Consequently, the changes in the shape and period of the pattern having projections and recesses can be suppressed. In the method for forming a diffraction grating with the mold, as described above, the accuracy of transferring the pattern having projections and recesses of the mold to the resin layer can be maintained.

In the method for forming a diffraction grating according to the present invention, the step of preparing a mold may include the steps of forming a rigid layer on the first base; forming a plurality of pattern portions by etching the rigid layer; forming a mask layer on the rigid layer, the mask layer covering each of the plurality of pattern portions in a separated manner; and forming the plurality of second bases by etching the rigid layer using the mask layer. In the method for forming a diffraction grating, a mold including a flexible first base and a plurality of rigid second bases disposed on the first base is preferably provided. The plurality of second bases of the mold each include the pattern portion and are spaced apart from each other with a predetermined distance. By forming a diffraction grating using such a mold, the accuracy of transferring the pattern having projections and recesses of the mold to the resin layer can be maintained.

In the method for forming a diffraction grating according to the present invention, the step of preparing a mold may include the steps of preparing a mold substrate having a surface on which a plurality of patterns each corresponding to the pattern portion are formed; applying a material for a rigid layer onto the surface of the mold substrate and solidifying the applied material to form the rigid layer; forming a mask layer on the rigid layer, the mask layer covering each of the plurality of patterns in a separated manner; forming the plurality of second bases by etching the rigid layer using the mask layer; and forming the first base on the plurality of second bases. In the method for forming a diffraction grating, a mold including a flexible first base and a plurality of rigid second bases disposed on the first base is preferably provided. The plurality of second bases of the mold each include the pattern portion and are spaced apart from each other with a predetermined distance. By forming a diffraction grating using such a mold, the accuracy of transferring the pattern having projections and recesses of the mold to the resin layer can be maintained.

In the method for forming a diffraction grating according to the present invention, an active layer is preferably formed between the substrate and the first semiconductor layer. According to this method for forming a diffraction grating, the accuracy of transferring the pattern having projections and recesses of the mold to the resin layer can be maintained in optical devices including an active layer.

In the method for forming a diffraction grating according to the present invention, the first base may be composed of polydimethylsiloxane (PDMS), polyethylene terephthalate (PET), or polymethyl methacrylate (PMMA) which are flexible materials. According to this method for forming a diffraction grating, since the first base is composed of PDMS, PET, or PMMA, the first base is bent along the surface of the resin layer when the pattern portion of the mold is pressed against the resin layer. Therefore, even if the surface of the resin layer has undulations, the pattern portion can be more fully pressed against the resin layer.

In the method for forming a diffraction grating according to the present invention, the second base may be composed of silicon dioxide which is a rigid material. According to this method for forming a diffraction grating, since the second bases are composed of silicon dioxide, the pattern portion of the mold can be prevented from being bent when the pattern portion is pressed against the resin layer. Therefore, the pattern having projections and recesses in the pattern portion can be prevented from being distorted and the changes in the shape and period of the pattern having projections and recesses can be suppressed.

In the method for forming a diffraction grating according to the present invention, the pattern for forming a diffraction grating, the pattern being formed in the pattern portion of the mold, is preferably a line-and-space pattern in which projections and recesses are alternately arranged in a periodical manner. The projections of the line-and-space pattern of the mold preferably have a height of 20 nm to 300 nm in a protruding direction.

In the method for forming a diffraction grating according to the present invention, the main surface of the substrate may have undulations with a difference in height of 1 µm to 10 µm, and the pattern for forming a diffraction grating, the pattern being formed in the pattern portion of the mold, preferably has projections whose height is substantially equal to or smaller than the undulations of the substrate. This method for forming a diffraction grating is particularly effective when the substrate has a main surface having undulations with a difference in height of 1 µm to 10 µm, and a fine pattern having projections and recesses (line-and-space pattern) whose height is substantially equal to or smaller than the undulations is formed in the first semiconductor layer formed on the substrate.

A method for producing an optical device including a diffraction grating according to an embodiment of the present invention includes the steps of preparing a mold including a pattern portion in which a pattern for forming a diffraction grating is formed; forming a first semiconductor layer on a substrate; forming a resin layer on the first semiconductor layer; pressing the pattern portion of the mold against the resin layer; forming the pattern for the diffraction grating in the resin layer by curing the resin layer while pressing the pattern portion against the resin layer; forming the diffraction grating in the first semiconductor layer by etching the first semiconductor layer using the patterned resin layer as an etching mask; and growing a second semiconductor layer on the diffraction grating, the second semiconductor layer having a refractive index different from that of the first semiconductor layer. The mold includes a first base and a plurality of second bases disposed on the first base. The first base is made of a flexible material. The second base is made of a rigid material. In addition, the plurality of second bases each include the pattern portion and are spaced apart from each other with a predetermined distance.

According to this method for producing an optical device including a diffraction grating, the pattern for a diffraction grating is formed by curing the resin layer while pressing the pattern portion of the mold against the resin layer. The surface of the substrate is not flat and may have undulations. In this case, the surface of the resin layer formed on the substrate is also not flat like the substrate. The plurality of second bases are disposed on the first base. Furthermore, the plurality of second bases each include the pattern portion and are spaced apart from each other with a predetermined distance. In addition, the first base of the mold is made of a flexible material, and the second base is made of a rigid material. When the pattern portion of the mold having such a structure is pressed against the resin layer, the first base is bent along the surface of the resin layer. Therefore, even if the surface of the resin layer has undulations, the pattern portion is more fully pressed against the resin layer. In addition, since the second bases have rigidity, the pattern portion of the mold can be prevented from being bent when the pattern portion is pressed against the resin layer. This can prevent the distortion of the pattern having projections and recesses in the pattern portion. Consequently, the changes in the shape and period of the pattern having projections and recesses can be suppressed. In the method for producing an optical device including a diffraction grating with the mold, as described above, the accuracy of transferring the pattern having projections and recesses of the mold to the resin layer can be maintained. By forming a diffraction grating by using the mold, an emission wavelength, a reflection wavelength or a guide wavelength of optical devices including a diffraction grating such as a DFB laser can be controlled to a desired wavelength.

A mold for nano-imprinting according to an embodiment of the present invention includes a first base made of a flexible material; and a plurality of second bases made of a rigid material. The plurality of second bases are disposed on the first base. The plurality of second bases each include a pattern portion in which a pattern for forming a diffraction grating is formed and are spaced apart from each other with a predetermined distance.

According to this mold for nano-imprinting, the plurality of second bases are disposed on the first base. Furthermore, the plurality of second bases each include the pattern portion and are spaced apart from each other with a predetermined distance. In addition, the first base of the mold is made of a flexible material, and the second base is made of a rigid material. Therefore, when a pattern for a diffraction grating is formed by pressing the pattern portion of the mold against a non-flat resin layer, the first base is bent along the surface of the resin layer. Thus, even if the surface of the resin layer has undulations, the pattern portion is more fully pressed against the resin layer. In addition, since the second bases have rigidity, the pattern portion of the mold can be prevented from being bent when the pattern portion is pressed against the resin layer. This can prevent the distortion of the pattern having projections and recesses in the pattern portion. Consequently, the changes in the shape and period of the pattern having projections and recesses can be suppressed. As described above, when a diffraction grating is formed by using the mold for nano-imprinting, the accuracy of transferring the pattern having projections and recesses of the mold for nano-imprinting to the resin layer can be maintained.

In the mold for nano-imprinting according to the present invention, the first base may be composed of polydimethylsiloxane (PDMS), polyethylene terephthalate (PET), or polymethyl methacrylate (PMMA) which are flexible materials. The second base may be composed of silicon dioxide.

DESCRIPTION OF THE PREFERRED EMBODIMENTS

Figure 1:
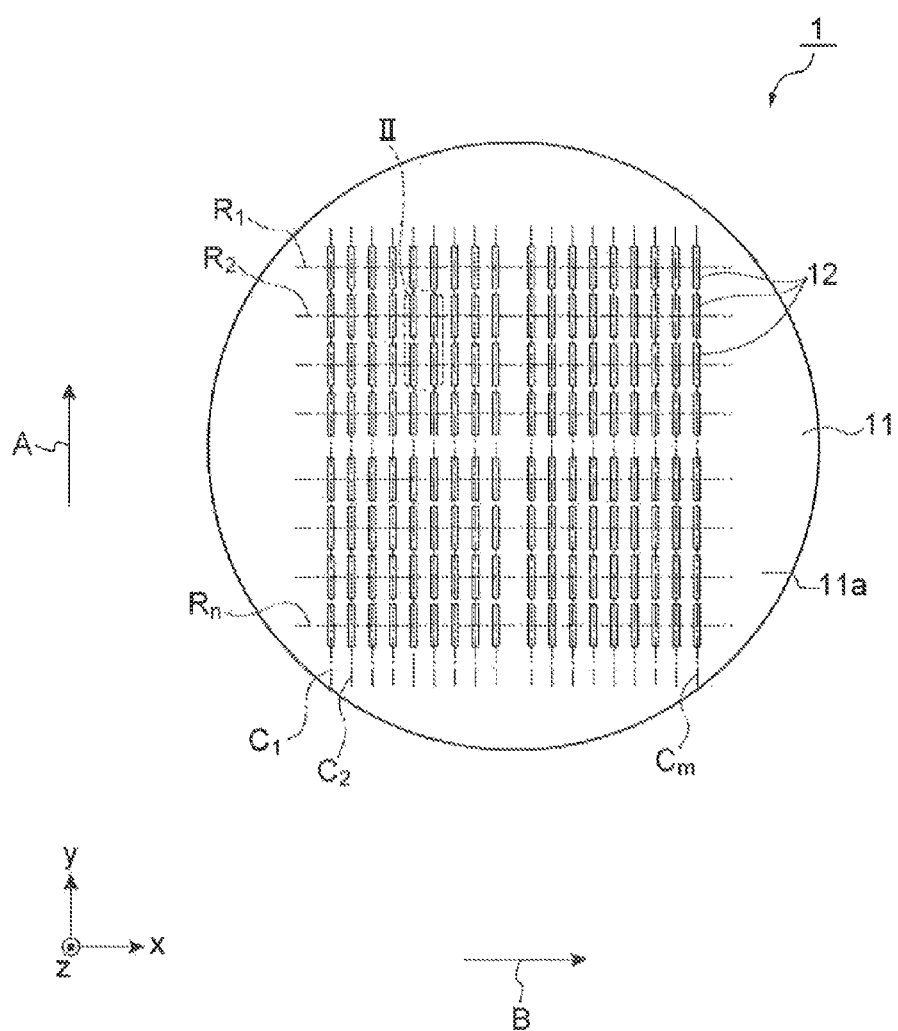
FIG. 1 is a plan view schematically showing a structure of a mold.

An embodiment of the present invention will now be described in detail with reference to the attached drawings. In the description of the drawings, the same reference numerals are used to indicate the same or corresponding devices and the redundant description is omitted.

Figure 2:
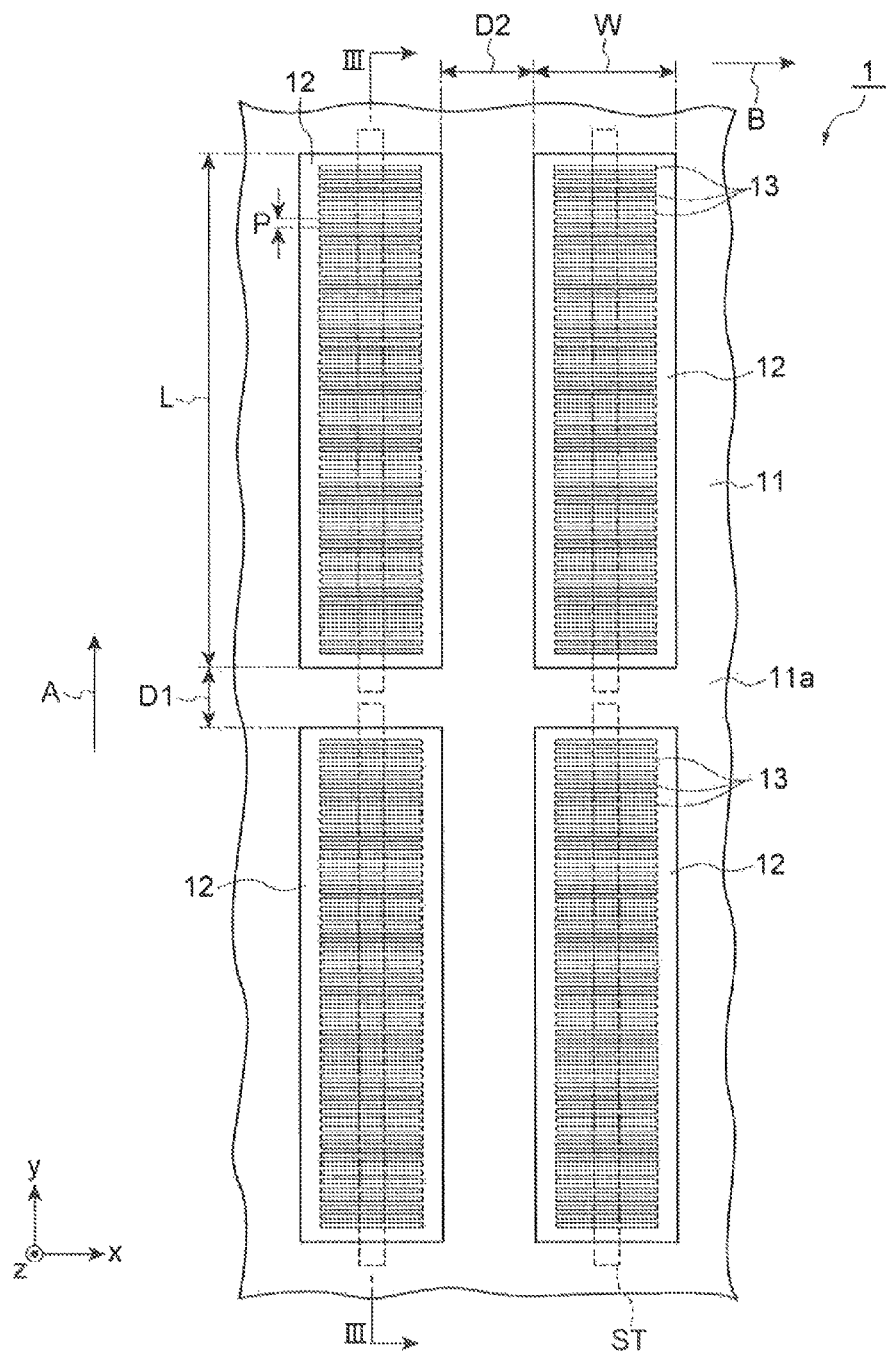
FIG. 2 is a partially enlarged plan view of the mold of FIG. 1.
Figure 3:
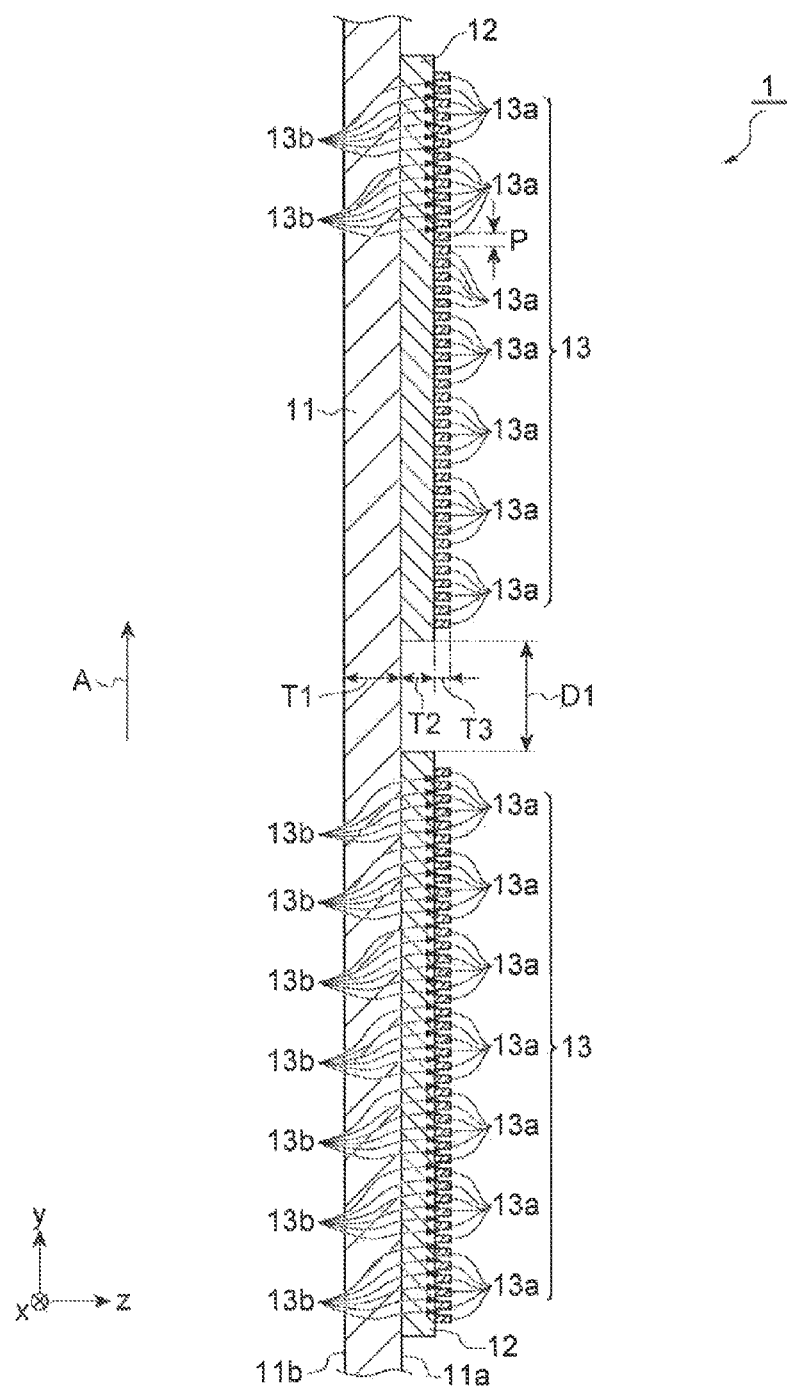
FIG. 3 is a sectional view taken along line III-III of FIG. 2.

FIG. 1 is a plan view schematically showing a structure of a mold according to this embodiment. FIG. 2 is a partially enlarged plan view of the mold. FIG. 3 is a sectional view taken along line III-III of FIG. 2. A mold 1 is, for example, a mold used to form a fine pattern by a nano-imprint technique. As shown in FIGS. 1 to 3, the mold 1 includes a first base 11, a plurality of second bases 12, and a pattern portion 13 including a plurality of periodic projections and recesses.

The first base 11 is flexible and has, for example, a disc-like shape. The first base 11 is, for example, a disc having a radius of about 100 mm. The first base 11 has a thickness T1 of, for example, 100 μm or more and 3 mm or less. The first base 11 is made of a flexible material, e.g., a resin such as polydimethylsiloxane (PDMS), polyethylene terephthalate (PET), or polymethyl methacrylate (PMMA). The first base 11 has a Young's modulus lower than that of the second bases 12, for example, about 0.1 to 5 GPa. The first base 11 has a main surface 11a on which the second bases 12 are disposed and a back surface 11b opposite to the main surface 11a. The back surface 11b of the first base 11 is pressed in a mold pressing step described below.

Each of the second bases 12 is rigid and has a rectangular plate-like shape that extends in a first direction A. The length L of the second base 12 in the first direction A is, for example, about 200 μm to 500 μm. The length (width) W of the second base 12 in a second direction B that intersects the first direction A is, for example, about 5 μm to 50 μm. The thickness T2 of the second base 12 is, for example, about 200 nm to 500 nm. The second base 12 is made of a rigid material such as silicon dioxide (quartz) or synthetic quartz. The second base 12 has a Young's modulus higher than that of the first base 11, for example, about 72 GPa.

The second bases 12 are disposed on the main surface 11a of the first base 11 so as to be in contact with the main surface 11a. In FIG. 1, columns $C_1$ to $C_m$ and rows $R_1$ to $R_n$ used to describe the arrangement of the second bases 12 are illustrated on the main surface 11a. The columns $C_1$ to $C_m$ each extend in the first direction A and are sequentially arranged at certain intervals. The rows $R_1$ to $R_n$ each extend in the second direction B and are sequentially arranged at certain intervals. The plurality of second bases 12 are disposed at intersection points of the columns C and rows R. In other words, the plurality of second bases 12 are arranged on the columns C with a distance D1 and on the rows R with a distance D2. The distance D1 is, for example, about 500 μm to 3 mm. The distance D2 is, for example, about 400 μm to 1 mm.

The pattern portion 13 includes a pattern having periodic projections and recesses for forming a diffraction grating and is disposed on a main surface 12a of each of the second bases 12. Specifically, the pattern having projections and recesses is a line-and-space pattern in which projections and recesses are alternately arranged in a periodical manner. The pattern portion 13 is made of a rigid material such as silicon dioxide (quartz) or synthetic quartz. The pattern portion 13 includes a plurality of projections 13a and a plurality of recesses 13b. The projections 13a and the recesses 13b are alternately arranged with a pitch (period) P in the first direction A. Here, the pitch is defined as a sum of a length of the projection 13a and a length of the recess 13b in the first direction A. The pitch P is determined in accordance with the reflection wavelength of the diffraction grating for desired light. The pitch P is about 200 nm to 300 nm, for example.

The projections 13a each extend in the second direction B and protrude in a direction of the normal to the main surface 12a. The length of the projection 13a in the first direction A is, for example, about 100 nm. The length of the projection 13a in the second direction B is less than or equal to the width W of the second base 12. In optical devices including a diffraction grating formed by using the mold 1, a stripe-shaped semiconductor mesa that extends in the first direction A is formed. Such a semiconductor mesa includes an active layer that generates light. In FIG. 2, a stripe region ST indicates a region in which the semiconductor mesa of an optical device is formed. For the purpose of forming a diffraction grating over the full width of the semiconductor mesa, the length of the projection 13a in the second direction B is larger than the width of the stripe region ST of the optical device. The height T3 of the projection 13a in a protruding direction is, for example, about 20 nm to 300 nm. Each of the recesses 13b is defined by two adjacent projections 13a and the main surface 12a of the second base 12 and extends in the second direction B. The length of the recess 13b in the first direction A is, for example, about 100 nm. The length of the recess 13b in the second direction B is substantially the same as the length of the projection 13a in the second direction B.

Figure 4:
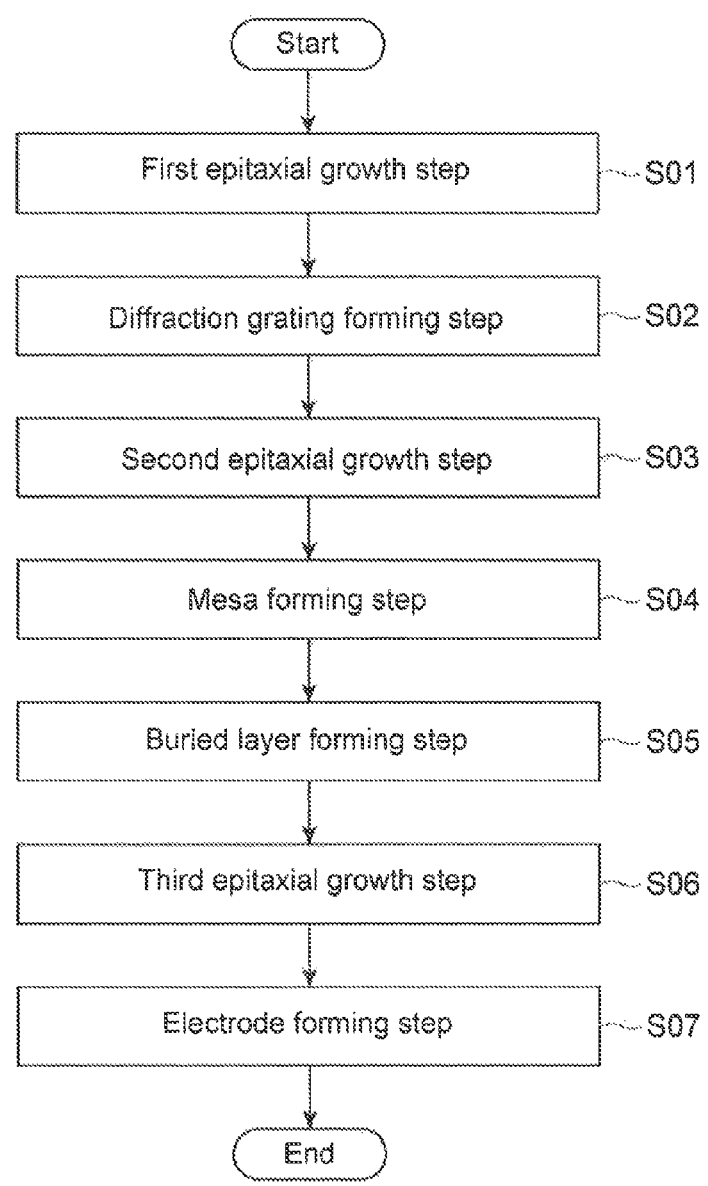
FIG. 4 is a flowchart showing an example of a method for producing a semiconductor optical device.
Figure 5:
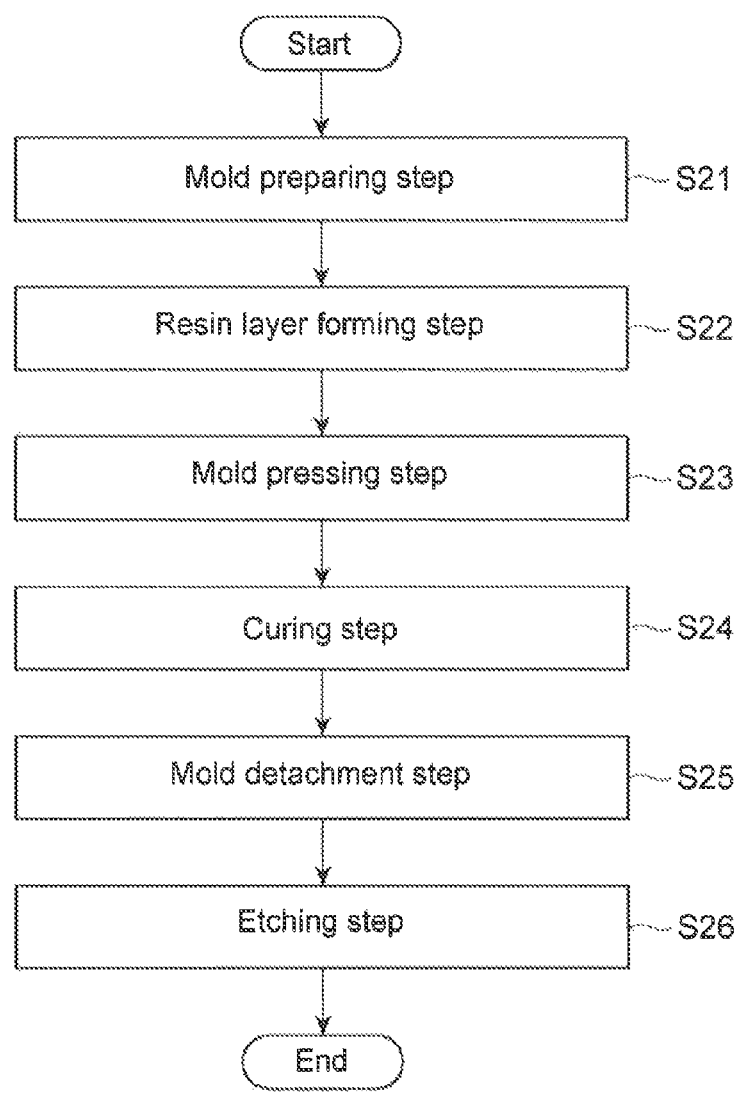
FIG. 5 is a flowchart showing an example of a method for forming a diffraction grating.
Figure 9A:
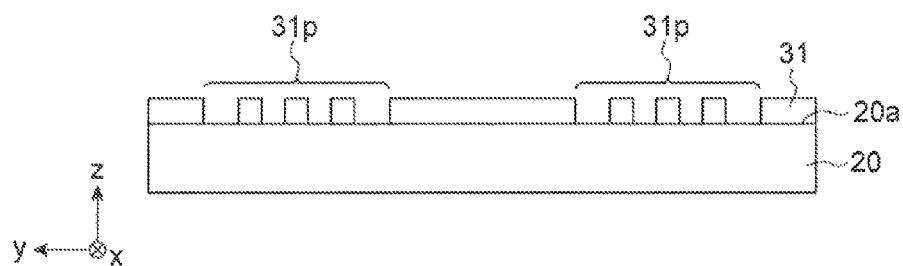
FIGS. 9A to 9C schematically show the subsequent steps of FIG. 8C.
Figure 9B:
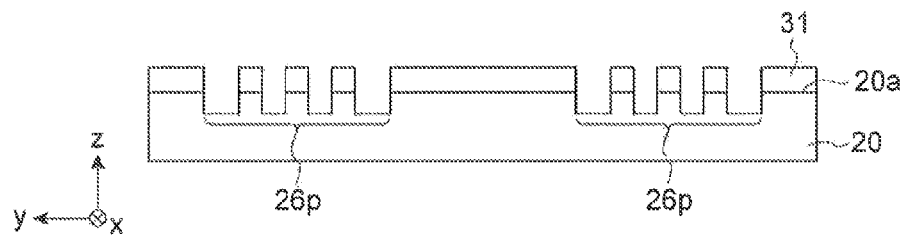
Figure 9C:
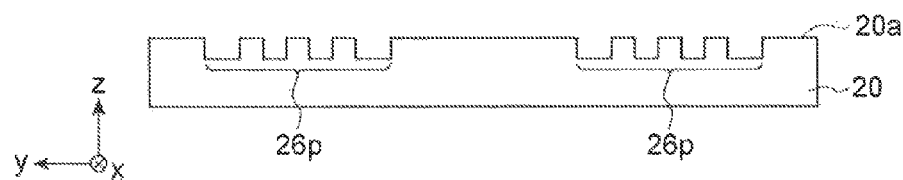
Figure 10A:
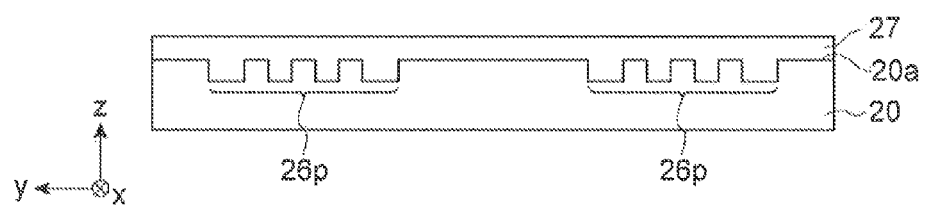
FIGS. 10A to 10C schematically show an example of the method for producing a semiconductor optical device.
Figure 10B:
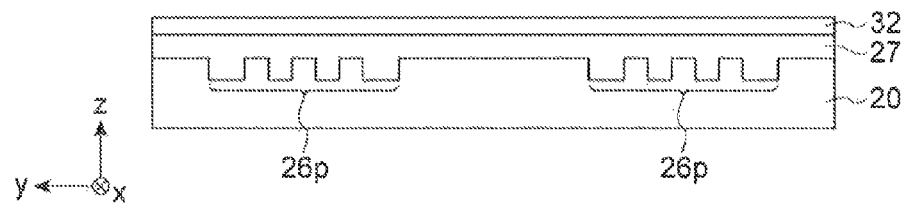
Figure 10C:
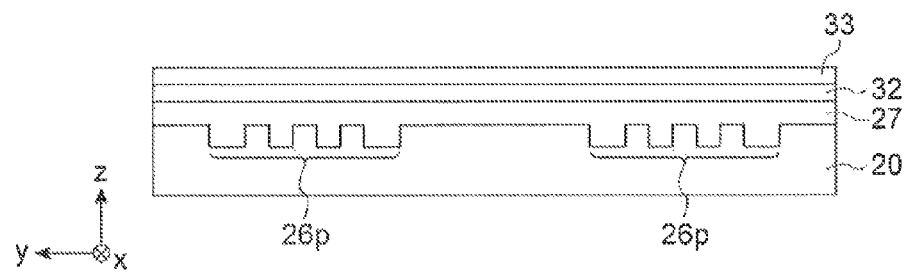
Figure 11A:
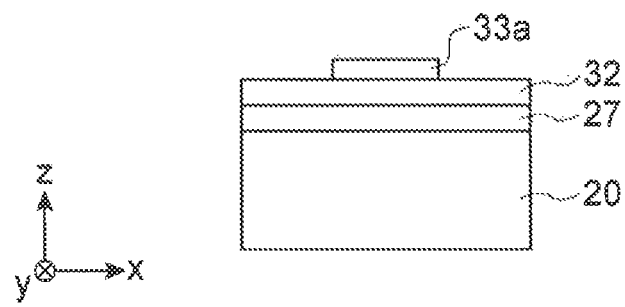
FIGS. 11A to 11C schematically show the subsequent steps of FIG. 10C.
Figure 11B:
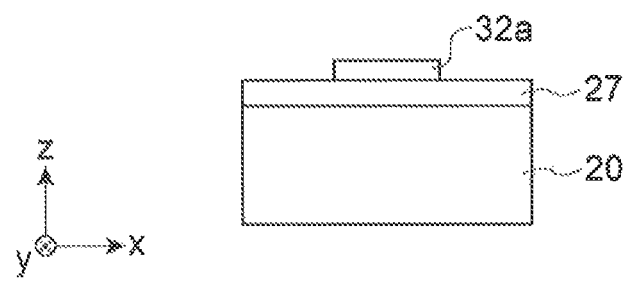
Figure 11C:
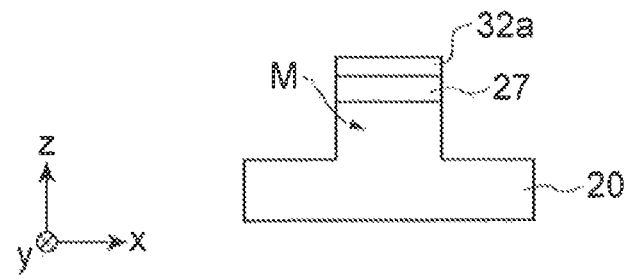
Figure 12A:
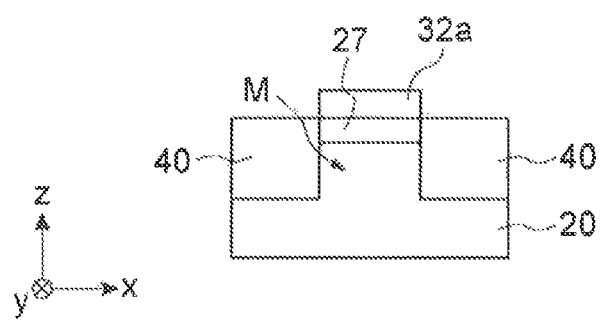
FIGS. 12A to 12C schematically show the subsequent steps of FIG. 11C.
Figure 12B:
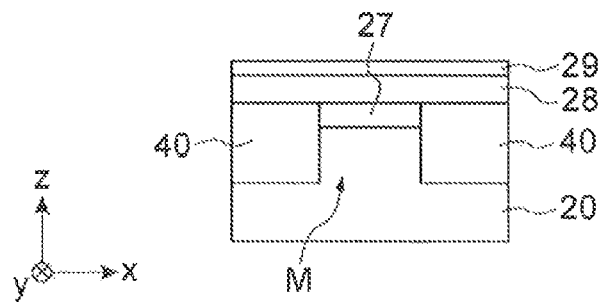
Figure 12C:
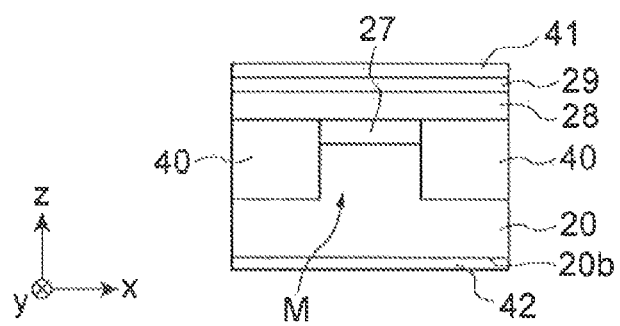
Figure 13:
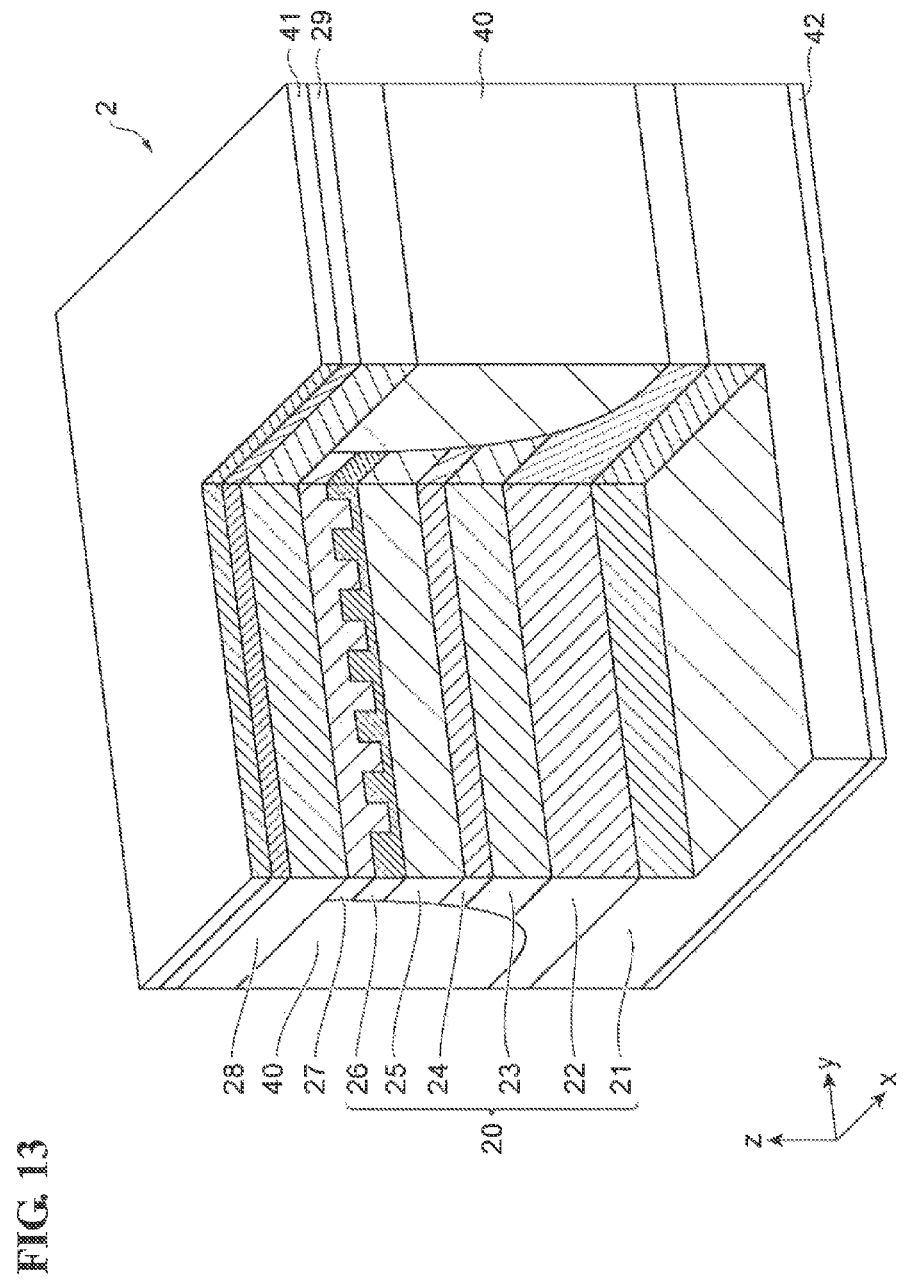
FIG. 13 is a partially broken perspective view of a semiconductor optical device produced by the production method shown in FIG. 4.

An example of a method for producing an optical device with the mold 1 will now be described with reference to FIGS. 4 to 13. FIG. 4 is a flowchart showing the method for producing a semiconductor optical device with the mold 1. FIG. 5 is a flowchart showing a method for forming a diffraction grating with the mold 1. FIGS. 6A to 9C schematically show a diffraction grating forming step S02. FIGS. 10A to 10C schematically show a second epitaxial growth step S03 and a mesa forming step S04. FIGS. 6A to 10C are sectional views taken along line III-III of FIG. 2. FIGS. 11A to 11C schematically show the mesa forming step S04 and are sectional views in a direction that intersects the first direction A. FIGS. 12A to 12C schematically show a buried layer forming step S05 to an electrode forming step S07 and are sectional views in a direction that intersects the first direction A. FIG. 13 is a partially broken perspective view of a semiconductor optical device 2 produced by the production method shown in FIG. 4.

As shown in FIG. 4, the method for producing the semiconductor optical device 2 with the mold 1 includes a first epitaxial growth step S01, a diffraction grating forming step S02, a second epitaxial growth step S03, a mesa forming step S04, a buried layer forming step S05, a third epitaxial growth step S06, and an electrode forming step S07.

Figure 8A:
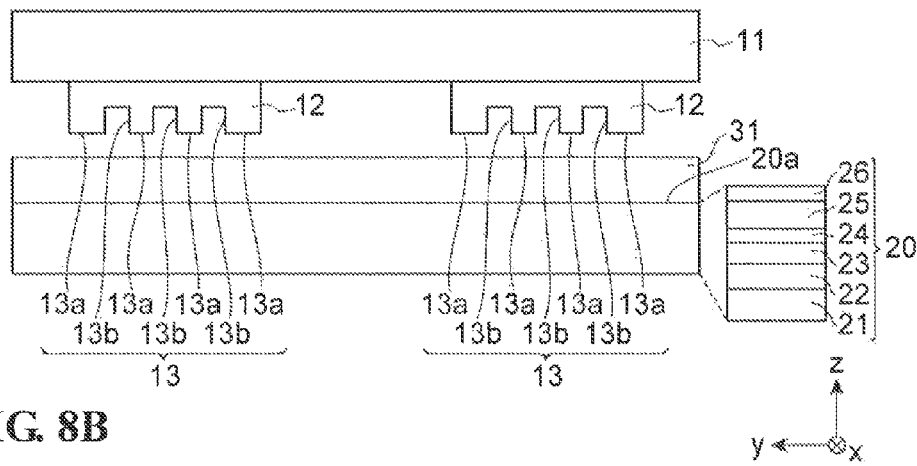
FIGS. 8A to 8C schematically show the subsequent steps of FIG. 7C.

In the first epitaxial growth step S01, as shown in FIG. 8A, a semiconductor region 20 is formed. For example, a first cladding layer 22, a first optical confinement layer 23, an active layer 24, a second optical confinement layer 25, and a diffraction grating layer 26 (first semiconductor layer) is sequentially grown on a main surface 21a of a substrate 21 in a direction of the normal to the main surface 21a of the substrate 21. The substrate 21 is composed of a group III-V compound semiconductor such as n-type InP. The first cladding layer 22 is composed of a group III-V compound semiconductor such as n-type InP. The first optical confinement layer 23 is composed of a group III-V compound semiconductor such as n-type GaInAsP. The active layer 24 has a multi quantum well structure containing, for example, GaInAsP. The second optical confinement layer 25 is composed of a group III-V compound semiconductor such as p-type GaInAsP. The diffraction grating layer 26 is composed of a group III-V compound semiconductor such as p-type GaInAsP. Note that the first optical confinement layer 23 and the second optical confinement layer 25 are not necessarily formed.

In the diffraction grating forming step S02, the diffraction grating is formed in the diffraction grating layer 26 in the semiconductor region 20. As shown in FIG. 5, the diffraction grating forming step S02 includes a mold preparing step S21, a resin layer forming step S22, a mold pressing step S23, a curing step S24, a mold detachment step S25, and an etching step S26.

Figure 6A:
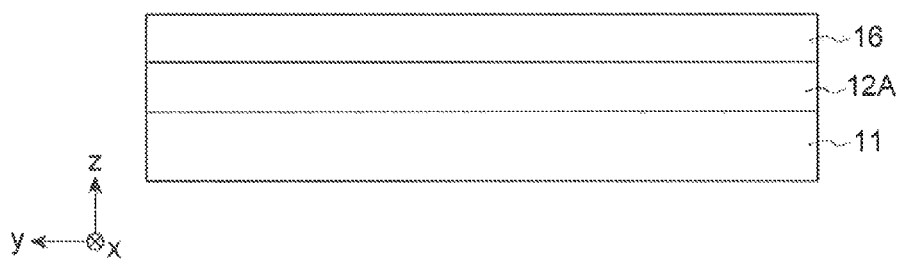
FIGS. 6A to 6C schematically show an example of the method for forming a diffraction grating.

In the mold preparing step S21, the mold 1 is prepared. The mold preparing step S21 is specifically described with reference to FIGS. 6A to 6C and 7A to 7C. As shown in FIG. 6A, a rigid layer 12A for forming second bases 12 is formed on a main surface 11a of a first base 11. The rigid layer 12A is made of a rigid material such as silicon dioxide (quartz). The rigid layer 12A is bonded to the main surface 11a of the first base 11 using an ultraviolet (UV) light curing adhesive or the like. The rigid layer 12A may be formed by applying, onto the main surface 11a, a liquid material prepared by dissolving a material for the rigid layer 12A in a solvent, such as a spin-on-glass (SOG) material, and then solidifying the liquid material through a heat treatment or the like. A resist 16 is then formed on the rigid layer 12A.

Figure 6B:
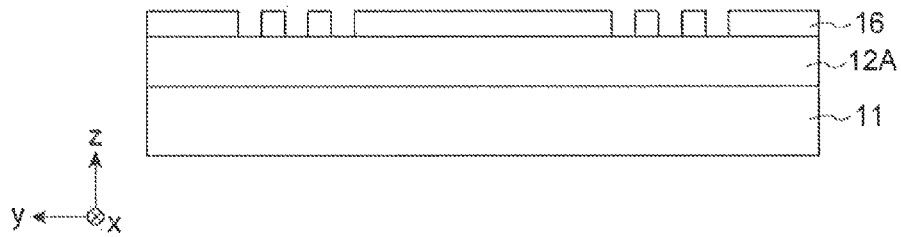
Figure 6C:
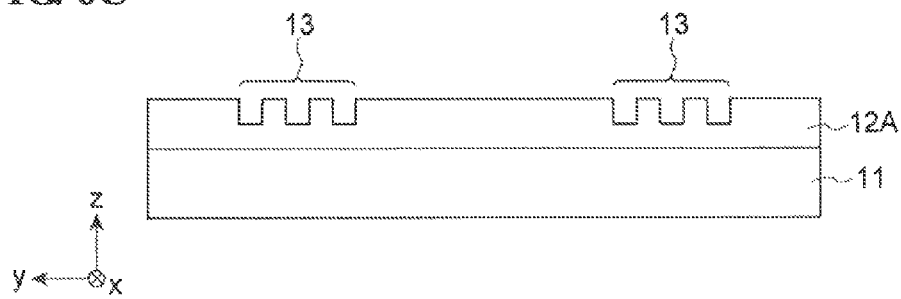

As shown in FIG. 6B, a pattern for providing a plurality of pattern portions 13 is then formed in the resist 16 by, for example, electron beam (EB) lithography. Subsequently, as shown in FIG. 6C, the rigid layer 12A is etched by, for example, reactive ion etching (RIE) with $CF_4$ using the resist 16 as an etching mask to form a plurality of pattern portions 13. The resist 16 is removed by, for example, plasma ashing with $O_2$.

Figure 7A:
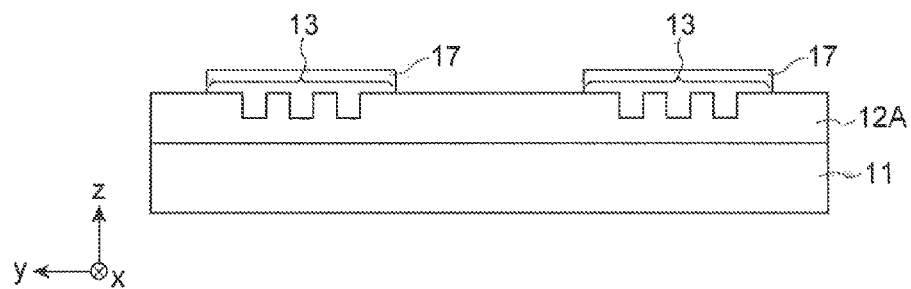
FIGS. 7A to 7C schematically show the subsequent steps of FIG. 6C.
Figure 7B:
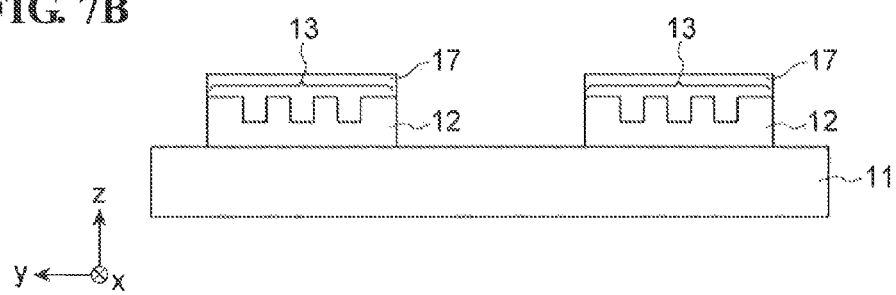
Figure 7C:
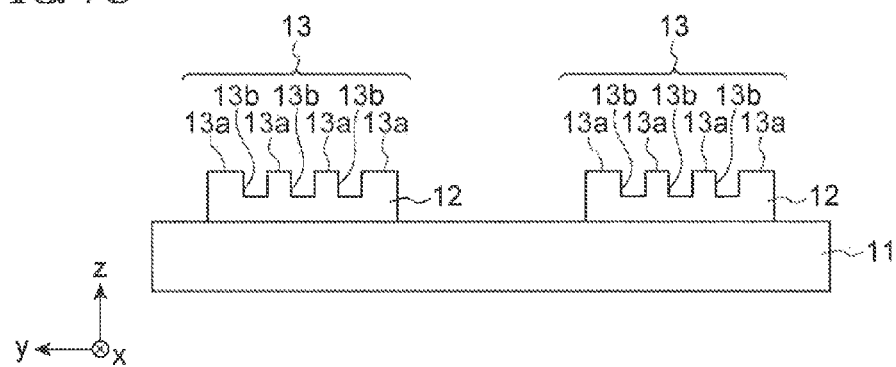

As shown in FIG. 7A, a photoresist 17 (mask layer) for providing a plurality of second bases 12 is then formed on the rigid layer 12A. The photoresist 17 is patterned by being exposed with an i-line stepper or the like. The photoresist 17 is formed so as to cover each of the plurality of pattern portions 13 in a separated manner. As shown in FIG. 7B, the rigid layer 12A is etched by, for example, RIE with $CF_4$ using the photoresist 17 as an etching mask until the main surface 11a of the first base 11 is exposed. Thus, a plurality of second bases 12 are formed. As shown in FIG. 7C, the photoresist 17 is removed by, for example, plasma ashing with $O_2$. Through the above process, the mold 1 is produced.

In the resin layer forming step S22, as shown in FIG. 8A, a resin layer 31 is formed on a main surface 20a of the semiconductor region 20 that has been formed in the epitaxial growth step S01. The resin layer 31 is formed by applying, for example, an ultraviolet curable resin onto the main surface 20a. The resin layer 31 may be composed of a thermoplastic resin.

Figure 8B:
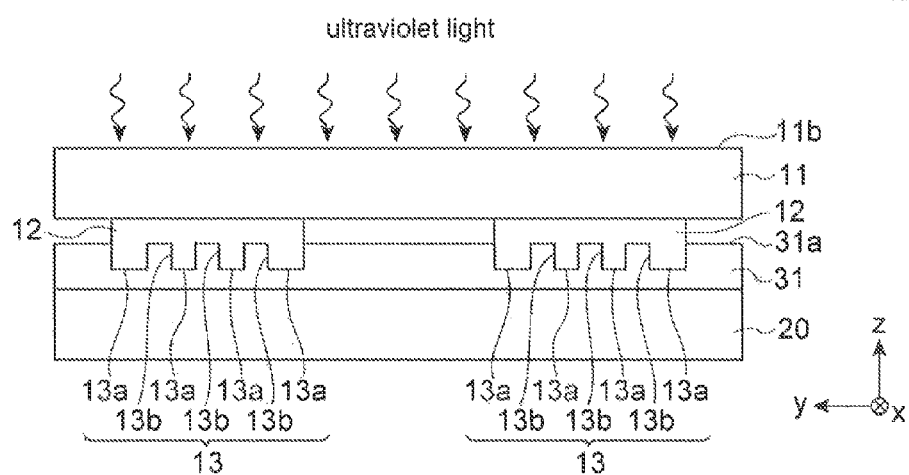

In the mold pressing step S23, as shown in FIG. 8B, the pattern portions 13 of the mold 1 are pressed against the resin layer 31 formed on the semiconductor region 20. Specifically, the mold 1 is placed on the resin layer 31 so that the pattern portions 13 are in contact with a surface 31a of the resin layer 31. The pattern portions 13 are pressed against the resin layer 31 by pressing the back surface 11b of the first base 11, the back surface 11b facing the second bases 12 with the first base 11 therebetween. As a result, projections 13a and recesses 13b in the pattern portions 13 are filled with the resin layer 31 and thus the pattern of the pattern portions 13 of the mold 1 is transferred to the resin layer 31.

In the curing step S24, the resin layer 31 is cured while the pattern portions 13 are being pressed against the resin layer 31 in the mold pressing step S23. When the resin layer 31 is composed of an ultraviolet curable resin, the resin layer 31 is cured by irradiating the resin layer 31 with ultraviolet light. When the resin layer 31 is composed of a thermoplastic resin, the resin layer 31 is softened by heating the resin layer 31 in the mold pressing step S23 and then the resin layer 31 is cured by decreasing the temperature while the pattern portions 13 of the mold 1 are being pressed against the resin layer 31.

Figure 8C:
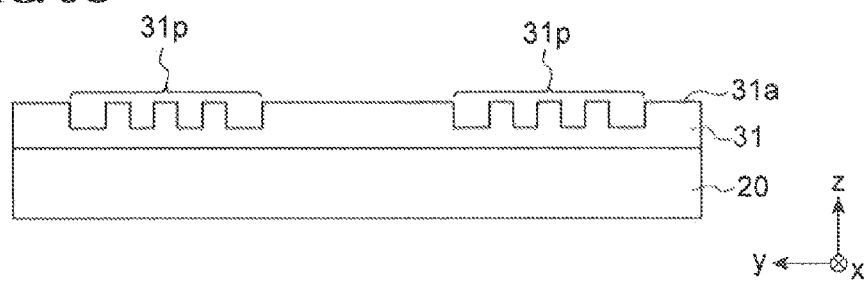

In the mold detachment step S25, as shown in FIG. 8C, the mold 1 is detached from the resin layer 31 that has been cured in the curing step S24. Through the above steps, patterns 31p for forming diffraction gratings are formed on the surface 31a of the resin layer 31. The patterns 31p correspond to the patterns of the pattern portions 13 of the mold 1.

In the etching step S26, the pattern of the pattern portions 13 is transferred to the semiconductor region 20. The etching step S26 is specifically described with reference to FIGS. 9A to 9C. As shown in FIG. 9A, the entire surface of the resin layer 31 is dry etched until the main surface 20a is exposed. As shown in FIG. 9B, the diffraction grating layer 26 of the semiconductor region 20 is etched by, for example, RIE with a gas mixture of $CH_4$ and $H_2$ using the resin layer 31 as an etching mask. As shown in FIG. 9C, the resin layer 31 is removed by, for example, plasma ashing with $O_2$.

Through the above steps, diffraction grating patterns 26p are formed in the diffraction grating layer 26 of the semiconductor region 20. The shape of the diffraction grating patterns 26p corresponds to the shape of the pattern portions 13 of the mold 1, and the period of the diffraction grating patterns 26p is determined in accordance with the reflection wavelength of the diffraction grating. In the embodiment, the diffraction grating patterns 26p reflect light with a wavelength of, for example, about 1.3 μm to 1.6 μm which is an important wavelength for optical fiber communication systems. To achieve the reflection of light with such a wavelength, the period of the projections and recesses in the diffraction grating patterns 26p needs to be set about 200 nm to 300 nm with a precision of about 0.1 nm.

Referring back to FIG. 4, the subsequent steps in the method for producing the semiconductor optical device 2 with the mold 1 are described. In the second epitaxial growth step S03, as shown in FIG. 10A, a second cladding layer 27 (second layer) is grown on the diffraction grating patterns 26p that have been formed in the diffraction grating forming step S02. As a result of the growth, the second cladding layer 27 covers the diffraction grating patterns 26p. The second cladding layer 27 is composed of a material different from that of the diffraction grating layer 26. The second cladding layer 27 is composed of a group III-V compound semiconductor such as p-type InP. The second cladding layer 27 has a refractive index different from that of the diffraction grating layer 26.

In the mesa forming step S04, a semiconductor mesa M is formed in the semiconductor region 20 and the second cladding layer 27. The mesa forming step S04 is specifically described with reference to FIGS. 10B, 10C, and 11A to 11C. As shown in FIG. 10B, an insulating layer 32 is deposited on the second cladding layer 27. The insulating layer 32 is composed of, for example, silicon dioxide ($SiO_2$) or silicon nitride (SiN). As shown in FIG. 10C, a resist 33 is further formed on the insulating layer 32. Subsequently, as shown in FIG. 11A, a stripe-shaped resist pattern 33a for forming a semiconductor mesa M is formed by a photolithography method. The resist pattern 33a has a width of, for example, about 1 μm to 3 μm and extends in the first direction A. As shown in FIG. 11B, the insulating layer 32 is etched using the resist pattern 33a to form a mask 32a. As shown in FIG. 11C, the second cladding layer 27 and the semiconductor region 20 are then etched by, for example, RIE with a gas mixture of $CH_4$ and $H_2$ using the mask 32a as an etching mask to form a semiconductor mesa M. The semiconductor mesa M extends in the first direction A and has a width of, for example, about 1 μm to 3 μm.

In the buried layer forming step S05, as shown in FIG. 12A, the semiconductor mesa M that has been formed in the mesa forming step S04 is buried with a semiconductor layer (buried layer) 40. Herein, the semiconductor layer 40 is selectively grown using the mask 32a. The semiconductor layer 40 contains a semi-insulating group III-V compound semiconductor such as Fe-doped InP. After the semiconductor mesa M is buried with the semiconductor layer 40, the mask 32a is removed.

In the third epitaxial growth step S06, as shown in FIG. 12B, a third cladding layer 28 and a contact layer 29 are sequentially grown on the semiconductor mesa M (second cladding layer 27) and the semiconductor layer 40. The third cladding layer 28 is composed of a group III-V compound semiconductor such as p-type InP. The contact layer 29 is composed of a group III-V compound semiconductor such as p-type GaInAs. The third cladding layer 28 is not necessarily formed.

In the electrode forming step S07, an upper electrode 41 is formed on the contact layer 29. Furthermore, a lower electrode 42 is formed on a back surface 20b of the semiconductor region 20 (substrate 21). The upper electrode 41 is constituted by, for example, Ti/Pt/Au. The lower electrode 42 is constituted by, for example, AuGeNi. Through the above process, the semiconductor optical device 2 such as a distributed feedback (DFB) laser is produced as shown in FIG. 13.

Figure 14A:
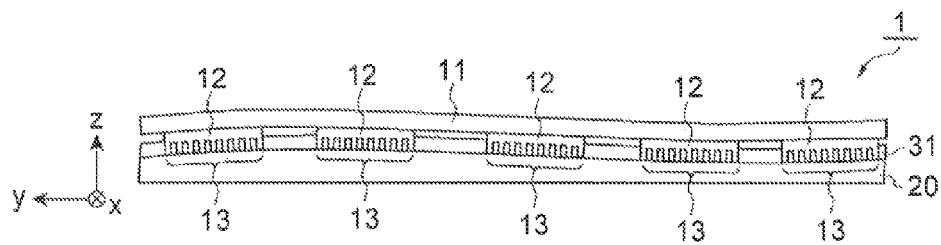
FIG. 14A shows the state in which the mold of FIG. 1 is being pressed against a resin layer.
Figure 14B:
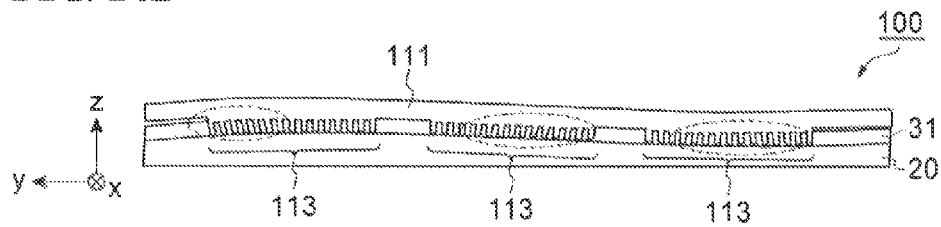
FIGS. 14B to 14D show the states in which a mold of comparative example is being pressed against a resin layer.
Figure 14C:
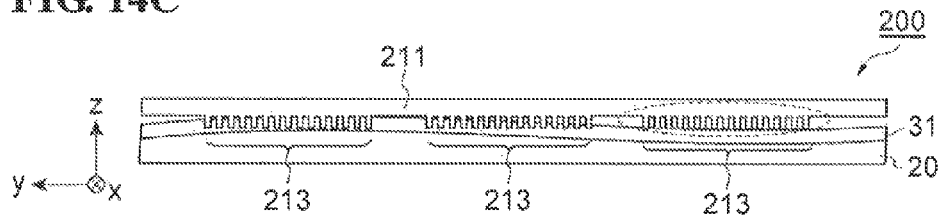
Figure 14D:
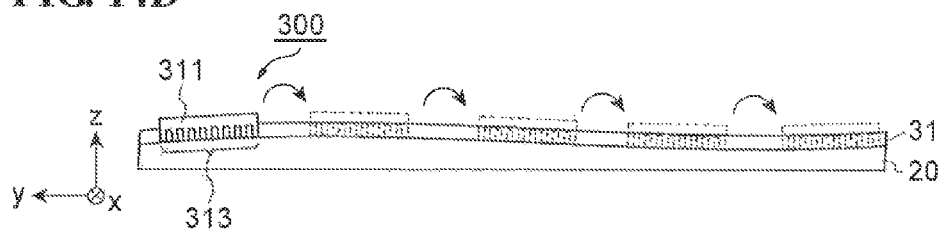

The detailed process in the method for forming a diffraction grating with the mold 1 and the method for producing an optical device with the mold 1 will now be described. FIG. 14A shows the state in which the mold 1 is being pressed against the resin layer 31. FIG. 14B shows the state in which a mold 100 of a first comparative example is being pressed against the resin layer 31. FIG. 14C shows the state in which a mold 200 of a second comparative example is being pressed against the resin layer 31. FIG. 14D shows the state in which a mold 300 of a third comparative example is being pressed against the resin layer 31. As shown in FIGS. 14A to 14D, the main surface 20a of the semiconductor region 20 is not flat and has undulations with a difference in height of, for example, about 1 μm to 10 μm. In this case, the surface 31a of the resin layer 31 disposed on the main surface 20a of the semiconductor region 20 is also not flat like the main surface 20a and has undulations with a difference in height of, for example, about 1 μm to 10 μm. On the other hand, the height T3 of projections in the pattern having projections and recesses of the mold in a protruding direction is substantially equal to or smaller than the height of the undulations of the main surface 20a. Therefore, the undulations of the main surface 20a or the undulations of the surface 31a of the resin layer 31 disposed on the main surface 20a exert considerable influence on a shape or an accuracy of dimension of a pattern formed on the resin layer 31 when a pattern formed in the pattern portions of the mold is transferred to the resin layer 31 by pressing the mold against the resin layer 31. The height T3 of projections in the pattern having projections and recesses of the mold is, for example, about 20 nm to 300 nm.

As shown in FIG. 14B, the mold 100 includes a base 111 and a plurality of pattern portions 113. The base 111 and the plurality of pattern portions 113 both have flexibility. Therefore, when the mold 100 is pressed against the resin layer 31, the mold 100 is bent along the surface 31a of the resin layer 31. Consequently, the pattern portions 113 are fully pressed against the resin layer 31. However, when the mold 100 is bent, the pattern having projections and recesses in the pattern portions 113 is distorted, which deforms the shape of the pattern having projections and recesses. As a result of this deformation of the pattern of the mold, for example, the period of projections and recesses also changes. The pattern formed on the resin layer 31 which is transferred from the pattern of the mold does not have a desired shape. Thus, a diffraction grating pattern formed in the resin layer 31 with the mold 100 has an undesired shape, and the period is shifted from the predetermined period. This changes the characteristics of a diffraction grating, such as a reflection wavelength and reflectivity. Furthermore, a desired emission wavelength is not achieved in DFB lasers including such a diffraction grating.

As shown in FIG. 14C, the mold 200 includes a base 211 and a plurality of pattern portions 213. The base 211 and the plurality of pattern portions 213 both have rigidity. Therefore, when the mold 200 is pressed against the resin layer 31, the mold 200 is not bent. Consequently, the pattern having projections and recesses in the pattern portions 213 is not distorted and thus the period of the pattern having projections and recesses does not change. However, the pattern portions 213 are not fully pressed against a depressed portion of the surface 31a of the resin layer 31. In this case, the accuracy of transferring the pattern having projections and recesses in the pattern portions 213 to the resin layer 31 decreases. This decreases the forming accuracy or uniformity of a diffraction grating pattern formed with the mold 200.

As shown in FIG. 14D, the mold 300 includes a base 311 and a single pattern portion 313. By repeatedly transferring a pattern having projections and recesses formed in the pattern portion 313 to the resin layer 31, diffraction grating patterns are formed on the entire surface of the resin layer 31. The base 311 and the pattern portion 313 both have rigidity. Therefore, when the mold 300 is pressed against the resin layer 31, the mold 300 is not bent. Consequently, the pattern having projections and recesses in the pattern portion 313 is not distorted and thus the period of the pattern having projections and recesses does not change. Furthermore, since the length of the mold 300 is smaller than that of the mold 200, the pattern portion 313 is fully pressed against the resin layer 31 even if the surface 31a of the resin layer 31 has undulations. However, as described above, since the mold 300 includes only the single pattern portion 313, the mold 300 needs to be repeatedly pressed against the resin layer 31. This decreases the efficiency of transferring the pattern having projections and recesses in the pattern portion 313 to the resin layer 31.

As shown in FIG. 14A, the plurality of second bases 12 are disposed on the first base 11 with a predetermined distance, and the first base 11 of the mold 1 has flexibility. When the mold 1 is pressed against the resin layer 31, portions of the first base 11 between the plurality of second bases 12 are bent along the surface 31a of the resin layer 31. Therefore, even if the surface 31a of the resin layer 31 has undulations, the pattern portions 13 are more fully pressed against the resin layer 31 compared with the case where the mold 200 is used. In addition, since the second bases 12 and the pattern portions 13 have rigidity, the second bases 12 and the pattern portions 13 can be prevented from being bent when the mold 1 is pressed against the resin layer 31. This can prevent the distortion of the pattern having projections and recesses in the pattern portions 13. Consequently, the changes in the shape and period of the pattern having projections and recesses can be prevented. In the method for forming a diffraction grating with the mold 1 and the method for producing an optical device with the mold 1, the accuracy of transferring the pattern having projections and recesses of the mold 1 to the resin layer 31 can be maintained. Optical devices including a diffraction grating pattern formed with the mold 1 provide light with a desired emission wavelength. The above-described effects are produced not only in the case where the main surface 20a of the semiconductor region 20 is not flat but also in the case where foreign matter is deposited on the surface 31a of the resin layer 31 and thus the surface is not flat.

First Modification

Figure 15A:
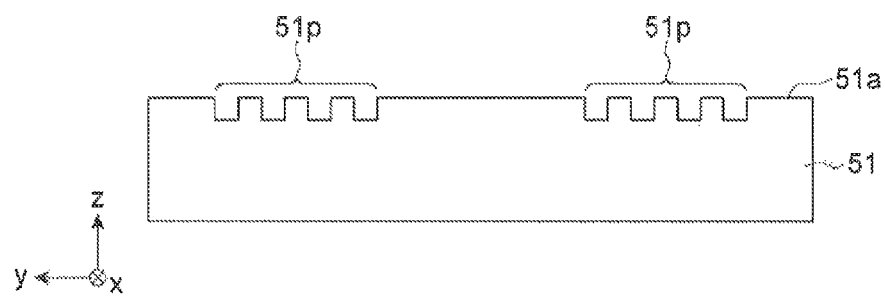
FIGS. 15A to 15C schematically show a first modification of a mold preparing step.

FIGS. 15A to 15C and 16A to 16C schematically show a first modification of the mold preparing step S21. In the first modification of the mold preparing step S21, as shown in FIG. 15A, a mold substrate 51 is prepared. The substrate 51 is made of silicon, for example. As in FIGS. 6A to 6C, a resist is formed on a main surface 51a of the substrate 51. A pattern for providing patterns 51p having projections and recesses is then formed in the resist by electron beam (EB) lithography or the like. Subsequently, the substrate 51 is etched by, for example, RIE with $CF_4$ using the resist as an etching mask to form a plurality of patterns 51p having projections and recesses. The resist is removed by, for example, plasma ashing with $O_2$.

Figure 15B:
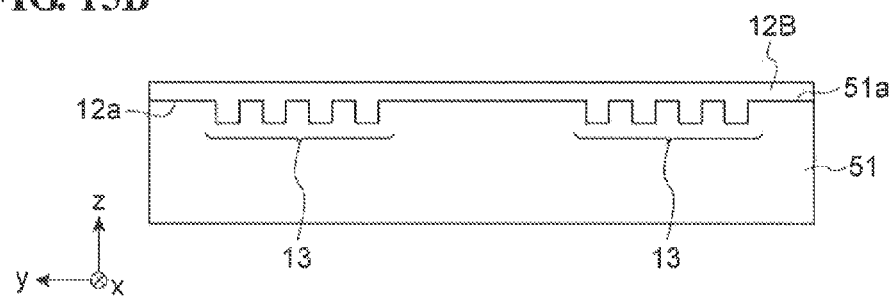

As shown in FIG. 15B, a spin-on-glass (SOG) material for forming a rigid layer 12B is then applied onto the entire main surface 51a of the substrate 51 by spin coating and thus each of the plurality of patterns 51p having projections and recesses is filled with the SOG material. The applied SOG material is cured, for example, at 350° C. to form a rigid layer 12B. The rigid layer 12B has a thickness of, for example, about 200 nm to 500 nm. The shape of the patterns 51p having projections and recesses of the substrate 51 is transferred to the rigid layer 12B to form a plurality of pattern portions 13 on one surface 12a of the rigid layer 12B.

Figure 15C:
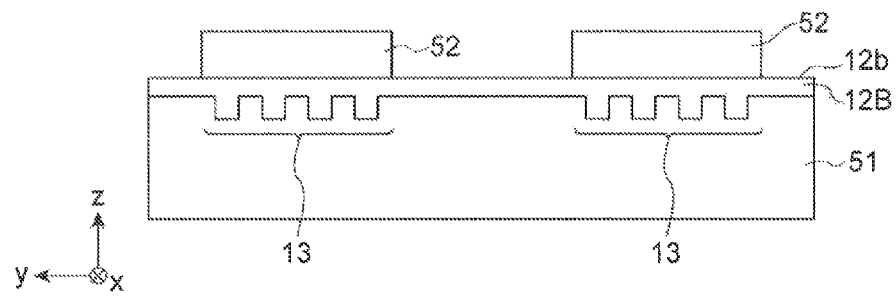
Figure 16A:
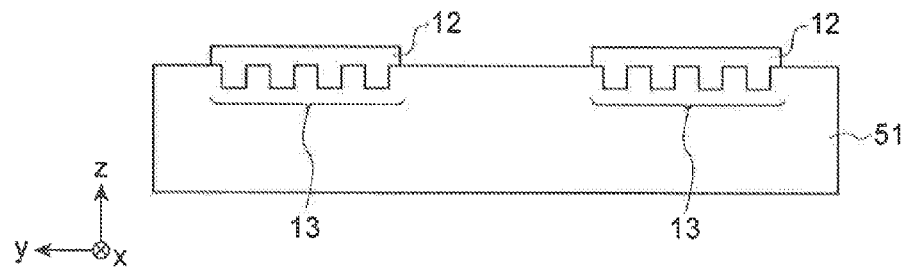
FIGS. 16A to 16C schematically show the subsequent steps of FIG. 15C.

As shown in FIG. 15C, a photoresist 52 (mask layer) for providing second bases 12 is formed on the other surface 12b of the rigid layer 12B. The photoresist 52 is patterned by a conventional photolithography method. The photoresist 52 is formed so as to cover each of the plurality of pattern portions 13 in a separated manner with the rigid layer 12B sandwiched therebetween. As shown in FIG. 16A, the rigid layer 12B is etched by, for example, RIE with $CF_4$ using the photoresist 52 as an etching mask to form a plurality of second bases 12. The photoresist 52 is removed by, for example, plasma ashing with $O_2$.

Figure 16B:
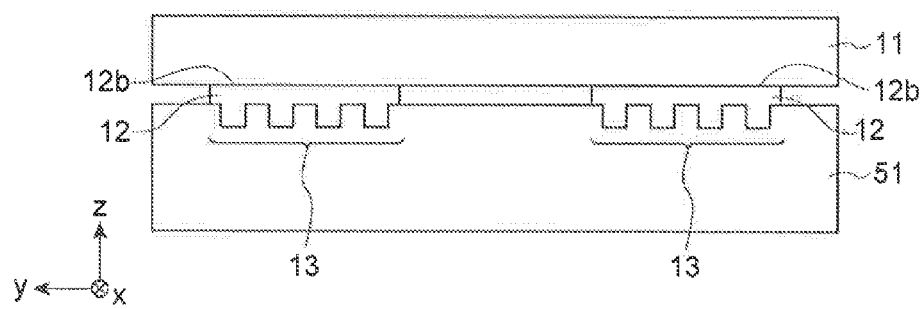
Figure 16C:
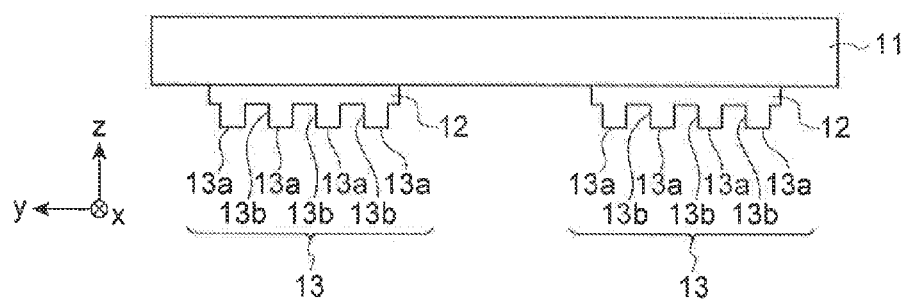

As shown in FIG. 16B, a first base 11 is then bonded to the other surfaces 12b of the plurality of second bases 12 that have been formed by etching. For example, the first base 11 is bonded to the other surfaces 12b of the plurality of second bases 12 using an ultraviolet curable resin as an adhesive. As shown in FIG. 16C, the second bases 12 are detached from the substrate 51. Through the above process, a mold 1 is produced. For the purpose of easily detaching the second bases 12 from the substrate 51, the main surface 51a may be surface treated with a silane coupling agent before the SOG material for forming the rigid layer 12B is applied onto the entire main surface 51a of the substrate 51 by spin coating (FIGS. 15A and 15B).

The mold 1 produced in the first modification also provides the same effects as those of the mold 1 in the above-described embodiment. Furthermore, in the first modification of the mold preparing step S21, there is no need to directly process fine pattern portions 13 in the rigid layer 12B. This means that silicon, which can be relatively easily processed and in which a semiconductor process technology is generally established, is directly processed. Therefore, the pattern portions 13, which are fine pattern portions, are easily formed with high accuracy.

Second Modification

Figure 17A:
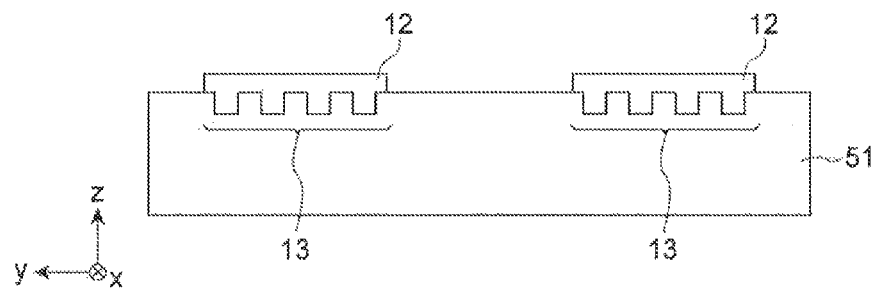
FIGS. 17A to 17C schematically show a second modification of a mold preparing step.
Figure 17B:
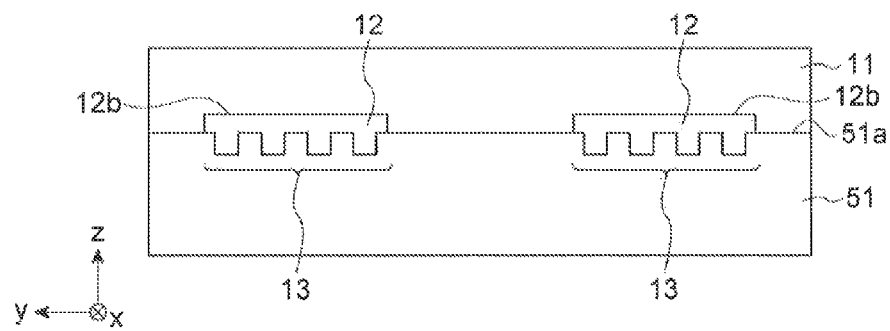
Figure 17C:
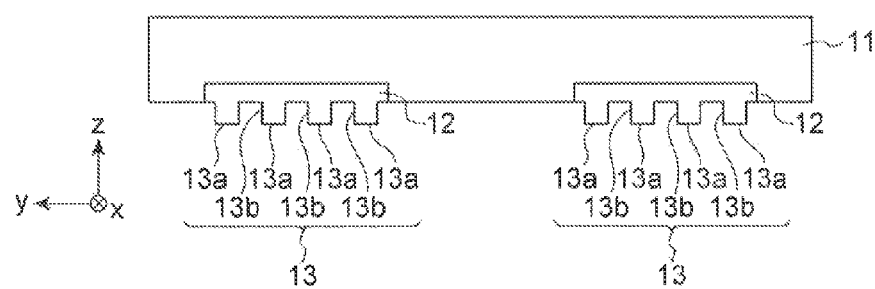

FIGS. 17A to 17C schematically show a second modification of the mold preparing step S21. As shown in FIG. 17A, a plurality of second bases 12 are formed on the main surface 51a of the substrate 51 as in the first modification. As shown in FIG. 17B, a liquid material for a first base 11 is then applied onto the entire main surface 51a of the substrate 51 so as to cover the other surfaces 12b of the second bases 12. Subsequently, the liquid material for a first base 11 is solidified to form a first base 11. As shown in FIG. 17C, the second bases 12 are detached from the substrate 51. Through the above process, a mold 1 is produced.

The mold 1 produced in the second modification also provides the same effects as those of the mold 1 in the above-described embodiment. In the mold 1 produced in the second modification, the second bases 12 are covered with the first base 11 except for the pattern portions 13. Therefore, the bonding strength between the first base 11 and the second bases 12 can be increased. A high degree of technique is required to uniformly bond the plurality of second bases 12, which are rigid bases, and the first base 11, which is a flexible base. However, the second modification employs a method in which a liquid material for the first base 11 is applied onto the other surfaces 12b of the second bases 12, and thus a bonding process with high accuracy is not required.

The mold for nano-imprinting, the method for forming a diffraction grating, and the method for producing an optical device including a diffraction grating according to embodiments of the present invention are not limited to the above-described embodiments. For example, the shape of the first base 11 is not limited to a round shape and may be a rectangular shape.

Furthermore, the pattern portions 13 may be composed of a material different from that of the second bases 12 or may be formed as bodies that are independent of the second bases 12. The pattern portions 13 may include a pattern having projections and recesses for forming a two-dimensional (2D) grating such as a photonic crystal. With this mold 1, a two-dimensional grating such as a photonic crystal can be formed.

A substrate composed of silicon dioxide (quartz) may be used instead of the semiconductor region 20. In this case, a diffraction grating can be formed in a silica-based optical waveguide using the mold 1.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for forming a diffraction grating, the method comprising the steps of:
    preparing a mold including a first base made of a flexible material, a plurality of second bases each made of a rigid material and disposed on the first base spaced apart from each other by a predetermined distance, and a plurality of pattern portions, each of the pattern portions being on one of the second bases and including pattern corresponding to a pattern for the diffraction grating;
    forming a first semiconductor layer on a main surface of a substrate;
    forming a resin layer on the first semiconductor layer;
    pressing the pattern portions of the mold against the resin layer;
    forming the patterns for the diffraction grating in the resin layer to obtain a patterned resin layer by curing the resin layer while pressing the pattern portions against the resin layer; and
    forming the diffraction grating in the first semiconductor layer by etching the first semiconductor layer using the patterned resin layer as an etching mask, wherein the step of preparing a mold includes the steps of:
        forming a rigid layer on the first base;
        forming the plurality of pattern portions by etching the rigid layer;
        forming a mask layer on the rigid layer, the mask layer covering each of the plurality of pattern portions in a separated manner; and
        forming the plurality of second bases by etching the rigid layer using the mask layer.

2. A method for forming a diffraction grating, the method comprising the steps of:
    preparing a mold including a first base made of a flexible material, a plurality of second bases each made of a rigid material and disposed on the first base spaced apart from each other by a predetermined distance, and a plurality of pattern portions, each of the pattern portions being on one of the second bases and including a pattern corresponding to a pattern for the diffraction grating;
    forming a first semiconductor layer on a main surface of a substrate;
    forming a resin layer on the first semiconductor layer;
    pressing the pattern portions of the mold against the resin layer;
    forming the patterns for the diffraction grating in the resin layer to obtain a patterned resin layer by curing the resin layer while pressing the pattern portions against the resin layer; and
    forming the diffraction grating in the first semiconductor layer by etching the first semiconductor layer using the pattern resin layer as an etching mask, wherein the step of preparing a mold includes the steps of:
        preparing a mold substrate having a surface on which a plurality of patterns each corresponding to one of the pattern portions are formed;
        applying a material for a rigid layer onto the surface of the mold substrate and solidifying the applied material to form the rigid layer;
        forming a mask layer on the rigid layer, the mask layer covering each of the plurality of patterns in a separated manner;
        forming the plurality of second bases by etching the rigid layer using the mask layer; and
        forming the first base on the plurality of second bases.

3. The method according to claim 1, wherein an active layer is formed between the substrate and the first semiconductor layer.

4. The method according to claim 1, wherein the first base is composed of polydimethylsiloxane, polyethylene terephthalate, or polymethyl methacrylate.

5. The method according to claim 1, wherein the second base is composed of silicon dioxide.

6. The method according to claim 1 wherein each pattern for the diffraction grating is a line-and-space pattern in which projections and recesses are alternately arranged in a periodical manner.

7. The method according to claim 6, wherein the projections have a height of 20 nm to 300 nm in a protruding direction.

8. The method according to claim 1,
    wherein the main surface of the substrate has undulations with a difference in height of 1 μm to 10 μm, and
    each pattern for the diffraction grating has projections whose heights are substantially equal to or smaller than the undulations of the substrate.

9. The method according to claim 2, wherein an active layer is formed between the substrate and the first semiconductor layer.

10. The method according to claim 2, wherein the first base is composed of polydimethylsiloxane, polyethylene terephthalate, or polymethyl methacrylate.

11. The method according to claim 2, wherein the second base is composed of silicon dioxide.

12. The method according to claim 2, wherein each pattern for forming a diffraction grating is a line-and-space pattern in which projections and recesses are alternately arranged in a periodical manner.

13. The method according to claim 12, wherein the projections have a height of 20 nm to 300 nm in a protruding direction.

14. The method according to claim 2,
    wherein the main surface of the substrate has undulations with a difference in height of 1 µm to 10 µm, and
    each pattern for forming a diffraction grating has projections whose heights are substantially equal to or smaller than the undulations of the substrate.

* * * * *